(12) United States Patent
Molnar

(10) Patent No.: US 11,107,953 B2
(45) Date of Patent: Aug. 31, 2021

(54) OPTOELECTRONIC SEMICONDUCTOR CHIP AND METHOD OF PRODUCING AN OPTOELECTRONIC SEMICONDUCTOR CHIP

(71) Applicant: OSRAM Opto Semiconductors GmbH, Regensburg (DE)

(72) Inventor: Attila Molnar, Gelugor (MY)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/607,781

(22) PCT Filed: May 16, 2018

(86) PCT No.: PCT/EP2018/062783
§ 371 (c)(1),
(2) Date: Oct. 24, 2019

(87) PCT Pub. No.: WO2018/215265
PCT Pub. Date: Nov. 29, 2018

(65) Prior Publication Data
US 2020/0075811 A1    Mar. 5, 2020

(30) Foreign Application Priority Data

May 22, 2017   (DE) ..................... 10 2017 111 123.9

(51) Int. Cl.
*H01L 33/38*   (2010.01)
*H01L 33/62*   (2010.01)

(52) U.S. Cl.
CPC ............ *H01L 33/387* (2013.01); *H01L 33/62* (2013.01); *H01L 2933/0033* (2013.01); *H01L 2933/0066* (2013.01)

(58) Field of Classification Search
CPC ....... H01L 33/387; H01L 33/62; H01L 33/46; H01L 33/44; H01L 2933/0033; H01L 2933/0066
See application file for complete search history.

(56) References Cited

U.S. PATENT DOCUMENTS

2003/0010989 A1   1/2003  Yukimoto
2005/0194605 A1*  9/2005  Shelton ............... H01L 33/62
                                                         257/99

(Continued)

FOREIGN PATENT DOCUMENTS

| DE | 10 2015 107 577 A1 | 11/2016 |
|----|---|---|
| EP | 2 343 744 A2 | 7/2011 |
| WO | 2009/010762 A1 | 1/2009 |

*Primary Examiner* — Galina G Yushina
(74) *Attorney, Agent, or Firm* — DLA Piper LLP (US)

(57) ABSTRACT

An optoelectronic semiconductor chip includes a semiconductor layer sequence having an active region arranged between first and second semiconductor layers; a first contact and a second contact for external electrical contacting of the semiconductor chip; first and second terminal layer regions, via which the first and second contacts electrically conductively connect to the first and second semiconductor layers; and a first insulation layer and a second insulation layer; wherein the first terminal layer region and the second terminal layer region are each arranged in some areas between the first insulation layer and the second insulation layer in a vertical direction perpendicular to a main extension plane of the active region; the first terminal layer region and the second terminal layer region are arranged side by side without overlapping; and the first terminal layer region extends in places up to a side surface of the semiconductor chip.

6 Claims, 7 Drawing Sheets

(56) References Cited

U.S. PATENT DOCUMENTS

| | | | |
|---|---|---|---|
| 2011/0156070 A1* | 6/2011 | Yoon | H01L 33/42 |
| | | | 257/98 |
| 2012/0199861 A1 | 8/2012 | Tsuji | |
| 2012/0256221 A1* | 10/2012 | Ogawa | H01L 33/405 |
| | | | 257/98 |
| 2014/0361327 A1* | 12/2014 | Chae | H01L 33/46 |
| | | | 257/98 |
| 2015/0144984 A1 | 5/2015 | Chen et al. | |
| 2015/0340346 A1 | 11/2015 | Chu et al. | |

* cited by examiner

US 11,107,953 B2

OPTOELECTRONIC SEMICONDUCTOR CHIP AND METHOD OF PRODUCING AN OPTOELECTRONIC SEMICONDUCTOR CHIP

TECHNICAL FIELD

This disclosure relates to an optoelectronic semiconductor chip and a method of manufacturing an optoelectronic semiconductor chip.

BACKGROUND

Light-emitting diode semiconductor chips in a so-called flipchip geometry can generate radiation with high efficiency. When mounted on a connection board, the substrate side of these semiconductor chips faces away from the connection board. The currently commercially available flipchip light-emitting diode semiconductor chips, however, are very complex in terms of their design and are therefore not competitive for many applications for cost reasons compared to simpler semiconductor chips whose substrate side faces the connection board when mounted on a connection board.

It could therefore be helpful to provide an optoelectronic semiconductor chip characterized by high efficiency in radiation generation, can be manufactured easily and cost-effectively, and a method by which a simple and cost-effective manufacture of optoelectronic semiconductor chips of high efficiency can be achieved.

SUMMARY

I provide an optoelectronic semiconductor chip including a semiconductor layer sequence having an active region that generates radiation, a first semiconductor layer and a second semiconductor layer, the active region being arranged between the first semiconductor layer and the second semiconductor layer; a first contact and a second contact for external electrical contacting of the semiconductor chip; a first terminal layer region, via which the first contact electrically conductively connects to the first semiconductor layer; a second terminal layer region, via which the second contact electrically conductively connects to the second semiconductor layer; and a first insulation layer and a second insulation layer; wherein the first terminal layer region and the second terminal layer region are each arranged in some areas between the first insulation layer and the second insulation layer in a vertical direction perpendicular to a main extension plane of the active region; the first terminal layer region and the second terminal layer region are arranged side by side without overlapping; and the first terminal layer region extends in places up to a side surface of the semiconductor chip.

I also provide a method of manufacturing an optoelectronic semiconductor chip including a) providing a semiconductor layer sequence having an active region that generates radiation, a first semiconductor layer and a second semiconductor layer, the active region being arranged between the first semiconductor layer and the second semiconductor layer; b) forming a recess in which the first semiconductor layer is exposed; c) forming a first insulation layer, the first insulation layer having at least one first opening to electrically contact the first semiconductor layer and at least one second opening to electrically contact the second semiconductor layer; d) forming a terminal layer on the first insulation layer, a first terminal layer region of the terminal layer being electrically conductively connected to the first semiconductor layer and a second terminal layer region of the terminal layer being electrically conductively connected to the second semiconductor layer, wherein the first terminal layer region extends in places up to a side surface of the semiconductor chip; e) forming a second insulation layer on the terminal layer, the second insulation layer having at least one first breakthrough to electrically contact the first terminal layer region and at least one second breakthrough to electrically contact the second terminal layer region; and f) forming a contact layer on the second insulation layer to form a first contact and a second contact for external electrical contact, the first contact being electrically conductively connected to the first semiconductor layer and the second contact being electrically conductively connected to the second semiconductor layer.

Figure 1A:
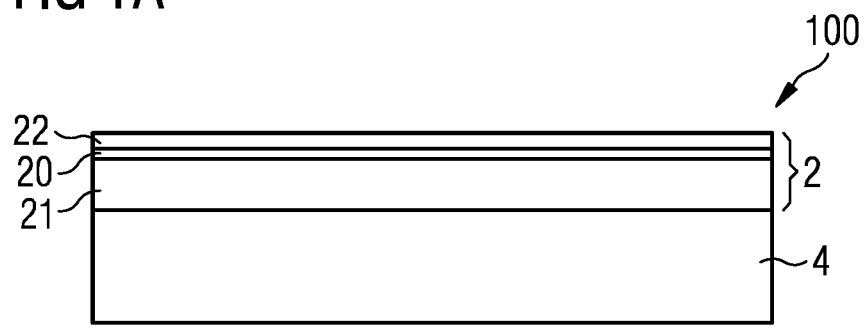
FIGS. 1A to 1L show an example of a method of manufacturing an optoelectronic semiconductor chip by schematic representations of intermediate steps, with FIGS. 1B, 1D, 1F, 1H, 1J and 1L each showing top views and FIGS. 1A, 1C, 1E, 1G, 1I and 1K each showing corresponding sectional views along line A-A'.
Figure 1B:

LIST OF REFERENCE SIGNS 1 optoelectronic semiconductor chip
15 side surface
100 composite
2 semiconductor layer sequence
20 active region
201 subregion
202 outer edge
205 side surface of the active region
21 first semiconductor layer
22 second semiconductor layer
25 recess
3 terminal layer
31 first terminal layer region
32 second terminal layer region
35 current expansion layer
4 substrate
5 contact layer
51 first contact layer
52 second contact layer
6 first insulation layer
601 first sublayer
602 second sublayer
61 first opening
62 second opening
7 second insulation layer
701 first sublayer
702 second sublayer
71 first breakthrough
72 second breakthrough
85 singulation line
9 mask

DETAILED DESCRIPTION

The optoelectronic semiconductor chip may comprise a semiconductor layer sequence with an active region that generates radiation. The semiconductor layer sequence, for example, is epitaxially deposited on a substrate, for instance by MOCVD or MBE. In particular, the substrate is part of the optoelectronic semiconductor chip. For example, the active region is arranged between a first semiconductor layer and a second semiconductor layer. It is expedient for the first semiconductor layer and the second semiconductor layer to be different with respect to their conduction type at least in places so that the active region is located in a pn junction. For example, the first semiconductor layer is n-conductive and the second semiconductor layer is p-conductive or vice versa. The active region is intended, for example, for the generation of radiation in the ultraviolet, visible or infrared spectral range. For example, the radiation to be generated is incoherent. For example, the active region is not located in a resonator.

The semiconductor chip expediently has a first contact and a second contact for external electrical contacting of the semiconductor chip. By applying an electrical voltage between the first contact and the second contact, charge carriers can enter the active region from opposite sides and recombine there, emitting radiation. The first contact and the second contact are in particular externally freely accessible areas of the optoelectronic semiconductor chip.

The first contact and the second contact are externally accessible, particularly from the same side of the semiconductor layer sequence, for example, from a side of the semiconductor layer sequence facing away from the substrate.

The optoelectronic semiconductor chip may comprise a first terminal layer region, via which the first contact electrically conductively connects to the first semiconductor layer. The first terminal layer region can directly adjoin the first semiconductor layer or connect to the first semiconductor layer via an electrically conductive intermediate layer. In a top view on the optoelectronic semiconductor chip, the first terminal layer region is especially free of overlap with the active region. For example, in the top view the first terminal layer region runs in some areas between adjacent subregions of the active region.

The optoelectronic semiconductor chip may comprise a second terminal layer region, via which the second contact electrically conductively connects to the second semiconductor layer. The second terminal layer region can directly adjoin the second semiconductor layer or electrically connect to the second semiconductor layer via an intermediate layer such as a current expansion layer.

The optoelectronic semiconductor chip may comprise a first insulation layer and a second insulation layer. The first insulation layer and the second insulation layer are intended in particular to electrically insulate layers electrically connected to the first contact from layers electrically connected to the second contact during operation of the optoelectronic semiconductor chip. For example, the first insulation layer and/or the second insulation layer contain a dielectric material such as an oxide or a nitride. In particular, the first insulation layer and/or the second insulation layer can also be multi-layered.

The first insulation layer and the second insulation layer are arranged at least in places on the same side of the active region in a vertical direction. For example, the first insulation layer and the second insulation layer at least partially cover the second semiconductor layer on the side facing away from the active region. For example, the first insulation layer and the second insulation layer adjoin each other in places.

A vertical direction is considered to be a direction perpendicular to a main extension plane of the active region.

Accordingly, a lateral direction is considered to be a direction running along the main extension plane of the active region.

The first insulation layer, for example, covers a side surface of the active region. A lateral electrical short circuit of the active region can be avoided by the first insulation layer. For example, the first insulation layer directly adjoins the side surface of the active region.

For example, the second insulation layer is arranged in some areas between the first contact and the second terminal layer region and/or between the second contact and the second terminal layer region. In particular, the second insulation layer can directly adjoin the first contact, the second contact and the second terminal layer region.

The first terminal layer region and the second terminal layer region may be arranged side by side without overlapping. During production, the first terminal layer region and the second terminal layer region can emerge from a common terminal layer. In particular, the first terminal layer region and the second terminal layer region may be produced by a common photolithographic mask.

The first terminal layer region and the second terminal layer region may each be arranged in some areas between the first insulation layer and the second insulation layer in a vertical direction.

In a vertical direction, the first terminal layer region and the second terminal layer region are thus embedded at least in places between two insulation layers. In particular, all outer surfaces of the first terminal layer region and/or the second terminal layer region that do not adjoin an electrically conductive material may adjoin the first insulation layer or the second insulation layer.

The optoelectronic semiconductor chip may comprise a semiconductor layer sequence having an active region that generates radiation, a first semiconductor layer and a second semiconductor layer, the active region being arranged between the first semiconductor layer and the second semiconductor layer. The optoelectronic semiconductor chip comprises a first contact and a second contact for external electrical contacting of the semiconductor chip. The optoelectronic semiconductor chip may comprise a first terminal layer region, via which the first contact electrically conductively connects to the first semiconductor layer. The optoelectronic semiconductor chip may comprise a second terminal layer region, via which the second contact electrically conductively connects to the second semiconductor layer. The optoelectronic semiconductor chip may comprise a first insulation layer and a second insulation layer. The first terminal layer region and the second terminal layer region may each be arranged in some areas between the first insulation layer and the second insulation layer in a vertical direction perpendicular to a main extension plane of the active region. The first and second insulation layers can be used to reduce radiation losses due to reflection at the first terminal layer region and at the second terminal layer region. Furthermore, the electrical contacting of the first semiconductor layer and the second semiconductor layer via the first terminal layer region and the first contact or the second terminal layer region and the second contact can be formed in common manufacturing steps for both polarities. The number of lithographic planes required for production can thus be reduced.

The first insulation layer and/or the second insulation layer may each comprise a plurality of sublayers and form a dielectric mirror structure. For example, the dielectric mirror structure is formed by an alternating stack of layers having a first refractive index and a second refractive index, the first refractive index being lower than the second refractive index. The higher the reflectivity of the dielectric mirror structure, the lower can be the amount of radiation that is generated in the active region and lost due to absorption losses within the semiconductor chip, for example, due to absorption by the first terminal layer region, the second terminal layer region, the first contact or the second contact.

The first terminal layer region may at least partially run around the active region in a lateral direction. For example, the first terminal layer region runs around the active region on at least two side surfaces or at least three side surfaces. In particular, the first terminal layer region can run all around the active region in a lateral direction. For example, the first terminal layer region runs around an outer edge of the active region in a frame-like manner. In case of doubt, the outer edge can be determined by an imaginary elastic band that is stretched around the active region of the semiconductor chip and completely surrounds the active region.

By the first terminal layer region, the radiation portion that exits laterally from the optoelectronic semiconductor chip can be reduced. In particular, absorption losses on a connection board to which the optoelectronic semiconductor chip is attached can be reduced.

The first terminal layer region may extend in places up to a side surface of the semiconductor chip. In particular, the first terminal layer region can be flush with the first semiconductor layer and/or flush with the substrate in a lateral direction. Absorption losses due to radiation emitted in the direction of the connection board can thus be reduced as far as possible.

The second insulation layer may run around the first terminal layer region in a lateral direction, in particular completely. In other words, an outer side surface of the first terminal layer region may be partially or completely surrounded by the second insulation layer. The second insulation layer thus can cause a lateral encapsulation of the first terminal layer region. A degradation of the first terminal layer region, e.g., due to oxidation, can thus be further reduced. Furthermore, the risk of migration of material from the first terminal layer region to other layers of the optoelectronic semiconductor chip can be avoided or at least reduced.

The first terminal layer region and the second terminal layer region may have the same material composition and the same layer thickness. In the manufacture of optoelectronic semiconductor chips, the first terminal layer region and the second terminal layer region can be formed from a common terminal layer. Material for the first terminal layer region and the second terminal layer region can thus be deposited in a common step, although one of the terminal layer regions is intended to contact the n side (e.g., the first semiconductor layer) and the other terminal layer region to contact the p side (e.g., the second semiconductor layer) of the optoelectronic semiconductor chip.

The semiconductor layer sequence may be arranged on a substrate, wherein the first contact and the second contact are arranged on a side of the semiconductor layer sequence facing away from the substrate, and radiation generated during operation of the semiconductor chip exits through the substrate. When the optoelectronic semiconductor chip is mounted, lost heat generated during operation can be dissipated from the semiconductor layer sequence directly to the connection board via the first contact and the second contact.

The lost heat does not have to pass through the substrate, which typically has a low thermal conductivity compared to metal layers.

We also provide a method of manufacturing an optoelectronic semiconductor chip.

A semiconductor layer sequence having an active region that generates radiation, a first semiconductor layer and a second semiconductor layer may be provided, the active region being arranged between the first semiconductor layer and the second semiconductor layer.

A recess may be formed in which the first semiconductor layer is exposed. In particular, the recess may penetrate the second semiconductor layer and the active region. For example, the recess forms an outer edge of the active region of the optoelectronic semiconductor chip to be manufactured.

A first insulation layer may be formed, the first insulation layer having at least one first opening to electrically contact the first semiconductor layer and at least one second opening to electrically contact the second semiconductor layer. In particular, the first insulation layer covers all areas of the semiconductor layer sequence not intended for the electrical contacting of the first semiconductor layer or the second semiconductor layer. For example, the insulation layer also covers a side surface of the active region.

A terminal layer may be formed on the first insulation layer. For example, a first terminal layer region of the terminal layer may electrically conductively connect to the first semiconductor layer and a second terminal layer region of the terminal layer may electrically conductively connect to the second semiconductor layer. The first terminal layer region and the second terminal layer region thus emerge from the same terminal layer. The terminal layer is formed by evaporation or sputtering, for example.

The method may comprise a step in which a second insulation layer is formed on the terminal layer, the second insulation layer having at least one first breakthrough for electrically contacting the first terminal layer region and at least one second breakthrough for electrically contacting the second terminal layer region. The second insulation layer in particular directly adjoins the first terminal layer region and the second terminal layer region.

The method may comprise a step in which a contact layer is formed on the second insulation layer to form a first contact and a second contact for external electrical contacting, the first contact being electrically conductively connected to the first semiconductor layer and the second contact being electrically conductively connected to the second semiconductor layer.

Formation of the first contact and the second contact thus takes place in a common deposition step and in particular also by a common photolithographic mask.

In particular, only five photolithographic planes are required for the entire production of the optoelectronic semiconductor chip. For example, the semiconductor layer sequence is structured with only one plane. Electrically insulating material can be applied by two planes. Electrically conductive material can be applied in two further planes.

A semiconductor layer sequence may be provided having an active region that generates radiation, a first semiconductor layer and a second semiconductor layer, the active region being arranged between the first semiconductor layer and the second semiconductor layer. A recess may be formed in which the first semiconductor layer is exposed. A first insulation layer may be formed, the first insulation layer having at least one first opening for electrically contacting the first semiconductor layer and at least one second opening for electrically contacting the second semiconductor layer. A terminal layer may be formed on the first insulation layer, a first terminal layer region of the terminal layer being electrically conductively connected to the first semiconductor layer and a second terminal layer region of the terminal layer being electrically conductively connected to the second semiconductor layer. A second insulation layer may be formed on the terminal layer, the second insulation layer having at least one first breakthrough for electrically contacting the first terminal layer region and at least one second breakthrough for electrically contacting the second terminal layer region. A contact layer may be formed on the second insulation layer to form a first contact and a second contact for external electrical contacting, the first contact being electrically conductively connected to the first semiconductor layer and the second contact being electrically conductively connected to the second semiconductor layer.

The active region may be divided into subregions spaced apart from each other when the at least one recess is formed. In particular, for each semiconductor chip to be manufactured, the active region has one subregion or a plurality of subregions.

The second insulation layer expediently has at least one second breakthrough for each subregion of the active region so that the subregions of the second semiconductor layer assigned to the respective subregions of the active region electrically conductively connect to one another via the second terminal layer. In particular, for the electrical contacting of the various subregions of the active region of a semiconductor chip to be manufactured, exactly one first contact and exactly one second contact can be used for external electrical contacting.

A current expansion layer may be applied to the semiconductor layer sequence, in particular directly adjacent to the second semiconductor layer. For example, the current expansion layer contains a TCO (Transparent Conductive Oxide) material. This promotes an even current injection into the active region in a lateral direction.

The current expansion layer may be applied to the semiconductor layer sequence before the recess is formed. The semiconductor layer sequence and the current expansion layer may be particularly structured using the same mask. No additional mask is required to structure the current expansion layer.

The semiconductor chip may be fabricated in a composite, the semiconductor chip being formed by singulating the composite. Singulation is carried out, for example, by sawing, chemically, for example, by etching, or by coherent radiation, for example, by a laser separation process.

Singulation expediently takes place after the contact layer has been formed, in particular after all photolithographic structures have been completed.

Singulation takes place, for example, along singulation lines, the active region along the singulation lines being already removed by the recess. The active region is therefore not cut through during singulation.

The first semiconductor layer may be cut through during singulation. Before singulation, there may be no structuring step in which the first semiconductor layer is completely cut through. The first semiconductor layer forms in places a side surface formed during singulation and delimits the semiconductor chip in a lateral direction.

The terminal layer may be cut through during singulation. The terminal layer may thus extend in some areas up to the side surface of the semiconductor chip in a lateral direction.

The terminal layer may not be cut through during singulation. Thus, already before singulation, the terminal layer may be formed such that no material of the terminal layer is present along the singulation lines.

The method described is particularly suitable for the manufacture of an optoelectronic semiconductor chip described above. Features mentioned in connection with the method can therefore also be used for the optoelectronic semiconductor chip and vice versa.

Further designs and functionalities will become apparent from the following description of the examples in connection with the figures.

Identical, similar or equivalent elements are provided with the same reference signs in the figures.

The figures are schematic representations and therefore not necessarily true to scale. Rather, comparatively small elements and, in particular, layer thicknesses can be displayed exaggeratedly large for clarification.

Figure 1C:
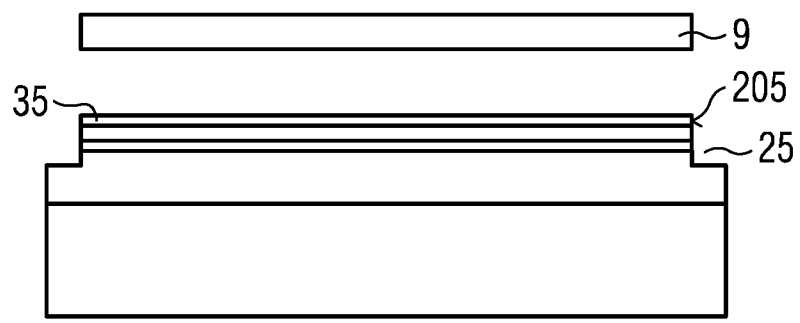
Figure 1D:
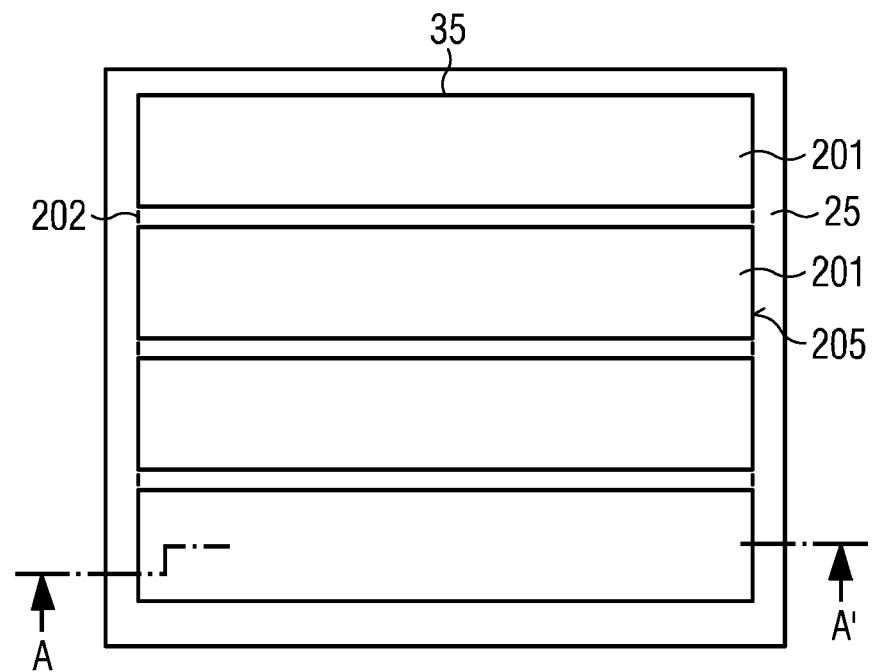
Figure 1E:
Figure 1F:
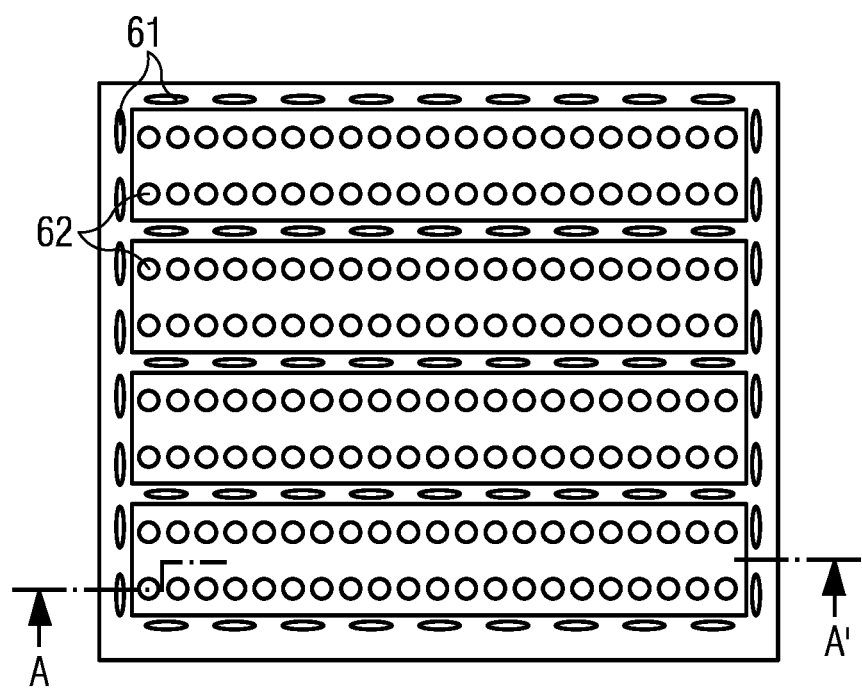
Figure 1G:
Figure 1H:
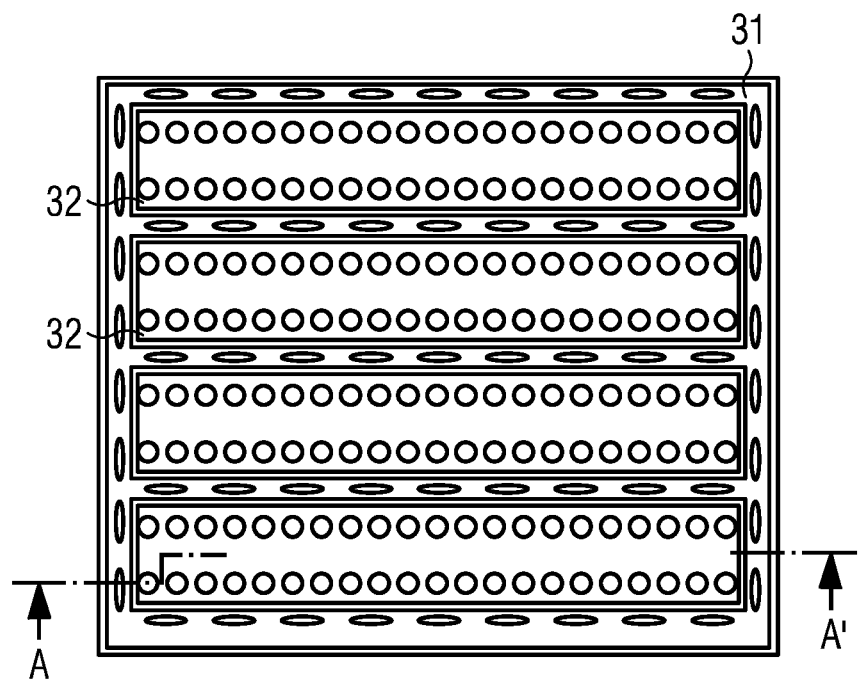
Figure 1I:
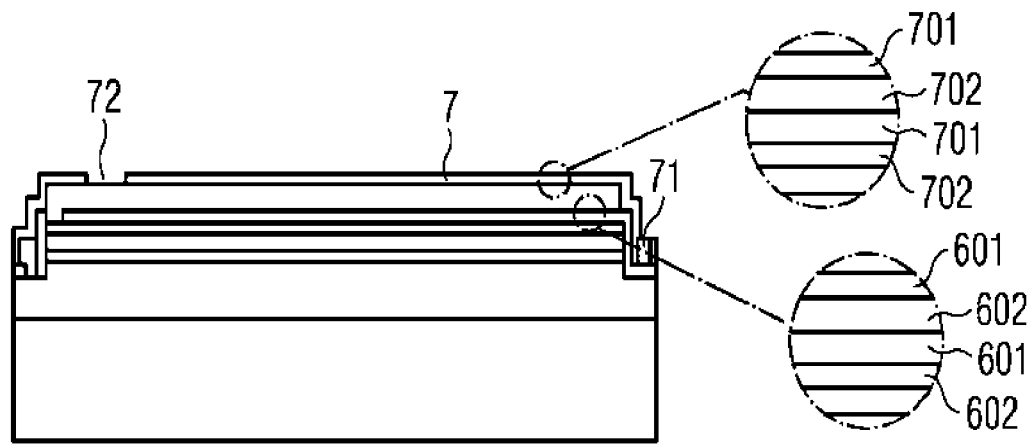
Figure 1J:
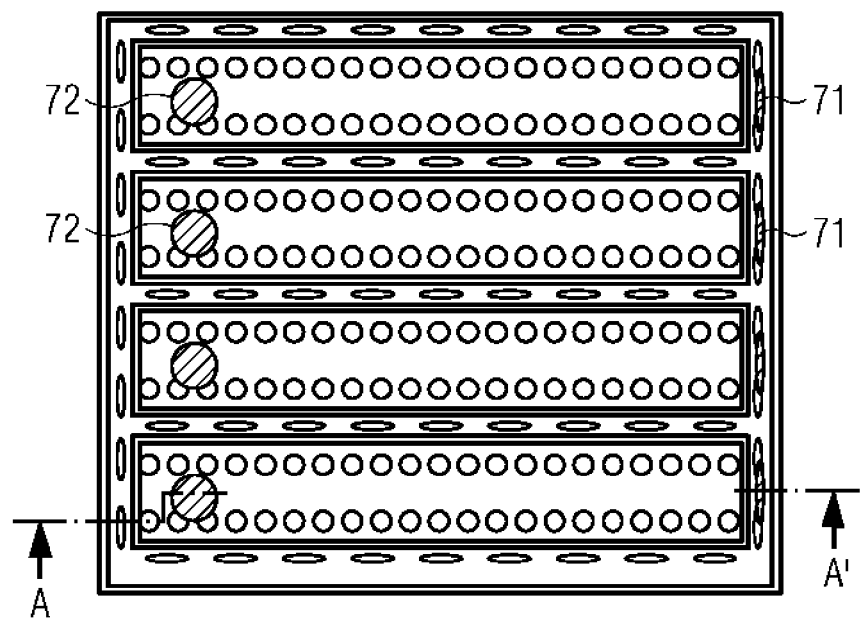
Figure 1K:
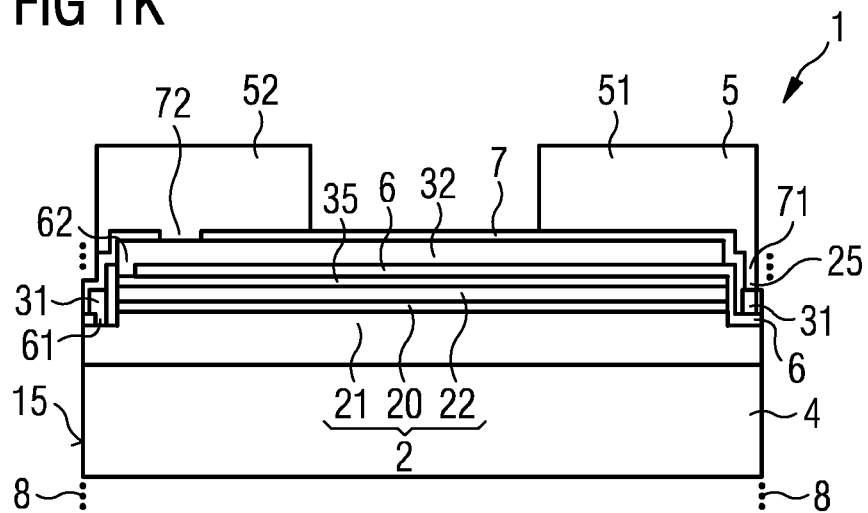
Figure 1L:
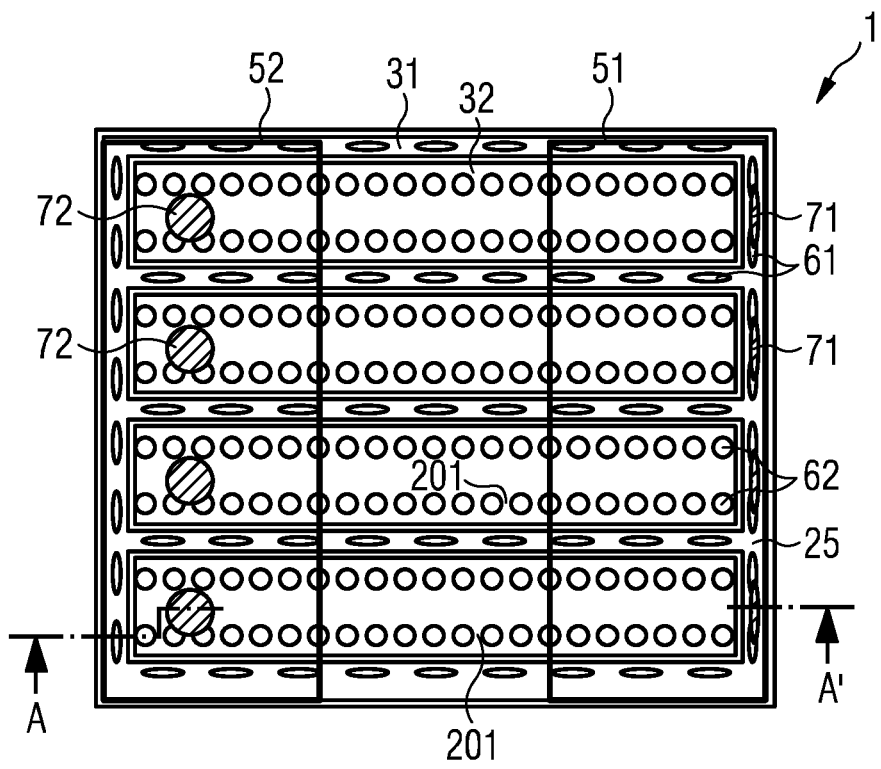

FIGS. 1A to 1L describe an example of a method of manufacturing an optoelectronic semiconductor chip, FIGS. 1K and 1L showing a finished optoelectronic semiconductor chip 1. For reasons of simplification, the figures only show a section of a composite 100 from which an optoelectronic semiconductor chip is formed by singulation along singulation lines 8 (FIG. 1K). For a simplified representation, only those elements in FIGS. 1C to 1J are provided with reference signs that are newly formed in the respectively assigned manufacturing step.

As shown in FIG. 1A, a semiconductor layer sequence 2 is provided on a substrate 4. The substrate 4, for example, is a growth substrate for the epitaxial deposition of semiconductor layers of the semiconductor layer sequence 2, e.g., by MOCVD or MBE. The substrate 4 is a sapphire substrate or a silicon carbide substrate, for example.

The semiconductor layer sequence 2 comprises a first semiconductor layer 21 of a first conductivity type, a second semiconductor layer 22 of a second conductivity type different from the first conductivity type, and an active region 20, wherein the active region 20 is arranged between the first semiconductor layer 21 and the second semiconductor layer 22. The first semiconductor layer is located between the substrate 4 and the active region 20. For example, the first semiconductor layer is n-conductive and the second semiconductor layer is p-conductive.

Subsequently, as shown in FIGS. 1C and 1D, a current expansion layer 35 is applied to the semiconductor layer sequence 2. The current expansion layer immediately adjoins the second semiconductor layer 22. The current expansion layer 35 contains a TCO material such as indium tin oxide (ITO), for example. The current expansion layer can also be multi-layered.

The current expansion layer 35 and the semiconductor layer sequence 2 are photolithographically structured by a mask 9. In this process, part of the current expansion layer 35 and material of the semiconductor layer sequence 2 is removed, for example, by wet chemical or dry chemical etching so that recesses 25 are formed in the semiconductor layer sequence 2, the recesses extending through the second semiconductor layer 22 and the active region 20 into the first semiconductor layer 21.

In the example shown, the active region 20 of a semiconductor chip to be manufactured is divided into a plurality of subregions 201 spaced apart from each other. Deviating from this, however, it is also possible that the active region 20 of an optoelectronic semiconductor chip extends continuously over the entire semiconductor chip to be manufactured. An outer edge 202 of the active region is illustrated by a dashed line, which is only visible in spaces between the subregions 201. All subregions 201 of the active region 20 run within the outer edge 202 of the active region.

Subsequently, a first insulation layer 6 is applied to the semiconductor layer sequence (FIGS. 1E and 1F). The first insulation layer 6 covers in some areas the second semiconductor layer 22 and a side surface 205 of the active region 20. The first insulation layer 6 is formed to have at least one first opening 61 and at least one second opening 62 for each semiconductor chip to be manufactured. The first semiconductor layer 21 can be electrically contacted in the at least one first opening 61. In the at least one second opening 62, the second semiconductor layer 22 can be electrically contacted, in particular via the current expansion layer 35.

In an example shown, each subregion 201 of the active region 20 has a plurality of second openings 62 (see, for example, FIG. 1L). This simplifies a uniform current supply to the second semiconductor layer 22. In principle, however, it is possible that each subregion 201 of the active region 20 only has one second opening 62.

The structuring of the first insulation layer 6 is carried out by a second photolithographic plane, wherein the first openings 61 and the second openings 62 can be formed in a common structuring step.

Subsequently, as shown in FIGS. 1G and 1H, a terminal layer 3 is formed on the semiconductor layer sequence. The terminal layer 3 is structured laterally such that the terminal layer 3 has at least one first terminal layer region 31 and one second terminal layer region 32. The first terminal layer region and the second terminal layer region are arranged side by side and spaced apart in a lateral direction. The terminal layer regions are thus arranged without overlapping each other. The first terminal layer region 31 is free of overlaps with the active region 20. In particular, the first terminal layer region can be continuous. The first terminal layer region 31 is electrically conductively connected to the first semiconductor layer 21 in the opening 61. The second terminal layer region 32 electrically conductively connects to the second semiconductor layer 22 in the second opening 62 of the insulation layer 6. The second terminal layer region in particular overlaps the active region 20 at every point.

The first terminal layer region 31 runs in a frame-like manner along a circumference of the optoelectronic semiconductor chip to be manufactured. In particular, the first terminal layer region 31 runs around the active region 20 in a lateral direction at least in places, in particular along the entire circumference.

The electrical contacting of the first semiconductor layer 21 and the second semiconductor layer 22 via the first terminal layer region 31 and the second terminal layer region 32, respectively, can thus be carried out in a common structuring step, for example, by a third photolithographic plane.

The terminal layer 3 can be single-layered or multi-layered. For example, the terminal layer may have one or more sublayers of a TCO material and/or one or more metallic layers. For example, silver is characterized by high reflectivity in the visible and ultraviolet spectral range. However, another metal may also be used such as aluminum, rhodium, palladium, platinum, titanium or chromium, or a metallic alloy containing at least one of these metals.

Subsequently, as shown in FIGS. 1I and 1J, a second insulation layer 7 is formed on the semiconductor layer sequence 2. The second insulation layer 7 is structured by a fourth photolithographic plane such that it has first breakthroughs 71 for the electrical contacting of the first terminal layer region 31 and second breakthroughs 72 for the electrical contacting of the second terminal layer region 32.

The second insulation layer 7 in particular directly adjoins the first terminal layer region 31, the second terminal layer region 32 and the first insulation layer 6.

Seen in a vertical direction, the terminal layer 3, in particular both the first terminal layer region 31 and the second terminal layer region 32, runs in places between the first insulation layer 6 and the second insulation layer 7.

The first insulation layer 6 and the second insulation layer 7 are arranged at least in places on the same side of the active region. In particular, the first insulation layer and the second insulation layer cover the second semiconductor layer 22 on the side of the second semiconductor layer facing away from the active region 20.

The first insulation layer 6 and the second insulation layer 7 can form a dielectric mirror and in particular each have a plurality of sublayers. This is shown in FIG. 1I using enlarged sections.

The first insulation layer 6 comprises a plurality of first sublayers 601 and second sublayers 602, the first sublayers each having a lower refractive index than the second sublayers.

Accordingly, the second insulation layer 7 comprises a plurality of first sublayers 701 and second sublayers 702, the first sublayers each having a lower refractive index than the second sublayers.

Silicon oxide or magnesium fluoride, for example, are suitable for a dielectric layer with a low refractive index. For a layer with a higher refractive index, titanium oxide or niobium(V)oxide ($Nb_2O_5$), for example, is suitable.

A multilayer design of the first insulation layer 6 and the second insulation layer 7 allows high reflectivities to be achieved so that absorption losses can be reduced in absorbing layers such as metal layers arranged downstream of the active region 20. The multilayer design of the first insulation layer 6 and the second insulation layer 7 can reduce the risk of cracking and thus reduce the sensitivity to moisture.

In a top view on the semiconductor layer sequence 2, at least one second breakthrough 72 overlaps with one subregion 201 of the active region in each case.

For the electrical contacting of the first terminal layer region 31, a plurality of first breakthroughs 71 are provided. In principle, however, a single breakthrough is sufficient for the electrical contacting of the first terminal layer region 31.

The structuring of the second insulation layer 7 can be carried out by a fourth photolithographic plane.

Subsequently, as shown in FIGS. 1K and 1L, a contact layer 5 is applied to the semiconductor layer sequence 2 in a structured manner such that the contact layer 5 has a first contact 51 and a second contact 52. The first contact and the second contact are intended for the external electrical contacting of the semiconductor chip 1 to be manufactured so that both contacts required for the electrical contacting of the semiconductor chip are externally accessible on a side of the semiconductor layer sequence 2 facing away from the substrate 4. The first contact 51 adjoins the first semiconductor layer 21 in the first breakthroughs 71. The second contact 52 adjoins the second semiconductor layer 22 in the second breakthroughs 72.

The structured application of the contact layer 5 can be carried out by a fifth photolithographic plane.

Subsequently, the composite 100 is singulated along the singulation lines 8, for example, mechanically, e.g., by sawing, chemically, e.g., by etching and/or by coherent radiation, e.g., by a laser separation process.

Singulation produces side surfaces 15 of the manufactured optoelectronic semiconductor chip 1. Singulation also cuts through the first semiconductor layer 21 so that the first semiconductor layer 21 and the substrate 4 are flush. The terminal layer 3 is structured in a lateral direction such that it is not present along the singulation lines 8. The terminal layer 3 is therefore not cut through during singulation. This means that the second insulation layer 7 can cover the first terminal layer region 31 laterally.

The terminal layer 3 can thus also be encapsulated in a lateral direction by the first insulation layer 6 and the second insulation layer 7. In this way, the terminal layer 3 can be protected against moisture or oxidation. Furthermore, it can be avoided that material of the terminal layer 3 migrates during operation of the semiconductor chip 1. For example, if silver is used for the terminal layer 3, silver migration into other layers of the optoelectronic semiconductor chip, especially into the semiconductor layers of the semiconductor layer sequence 2, can be avoided.

FIG. 1L shows a top view of the finished optoelectronic semiconductor chip 1.

With the method described, only five photolithographic planes are required to produce an optoelectronic semiconductor chip having both contacts intended for external electrical contacting on the side of the semiconductor layer sequence 2 facing away from the substrate 4.

When such an optoelectronic semiconductor chip is mounted on a connection board such as a lead frame or a printed circuit board, the first contact 51 and the second contact 52 face the connection board. As a result, the semiconductor layers of the semiconductor layer sequence 2 are located closer to the connection board. The heat dissipation of lost heat during operation of the optoelectronic semiconductor chip can thus be improved. In particular, the heat does not have to be dissipated via the substrate 4 so that a material with comparatively low thermal conductivity such as sapphire, is also suitable for the substrate.

In addition, absorption losses within the optoelectronic semiconductor chip can be reduced by the first insulation layer 6 and the second insulation layer 7, each of which is designed in particular as a dielectric mirror structure.

Instead of a multi-layer structure for the first insulation layer 6 and the second insulation layer 7, a single-layer structure can also be used for one of the insulation layers or both insulation layers, for example, with a layer of silicon oxide. This simplifies the manufacture of the optoelectronic semiconductor chip.

Figure 2A:
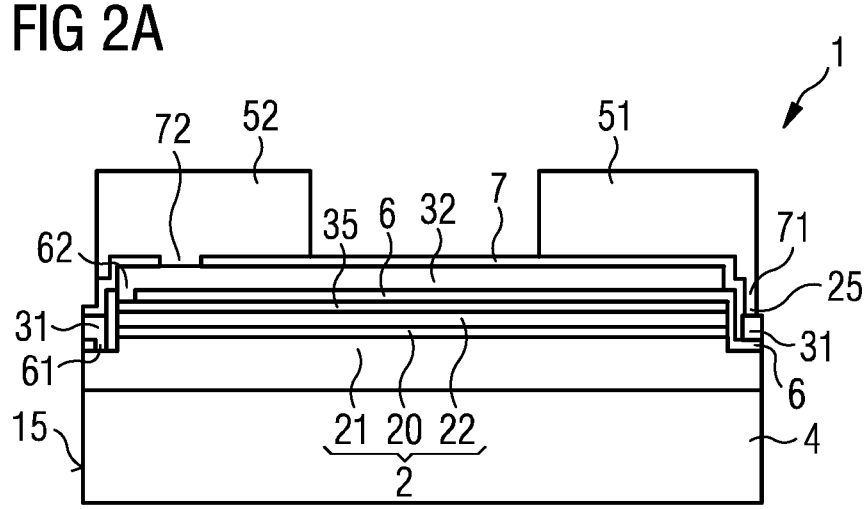
FIGS. 2A and 2B show an example of an optoelectronic semiconductor chip in a top view (FIG. 2B) and the corresponding sectional view along line B-B' in FIG. 2A.
Figure 2B:
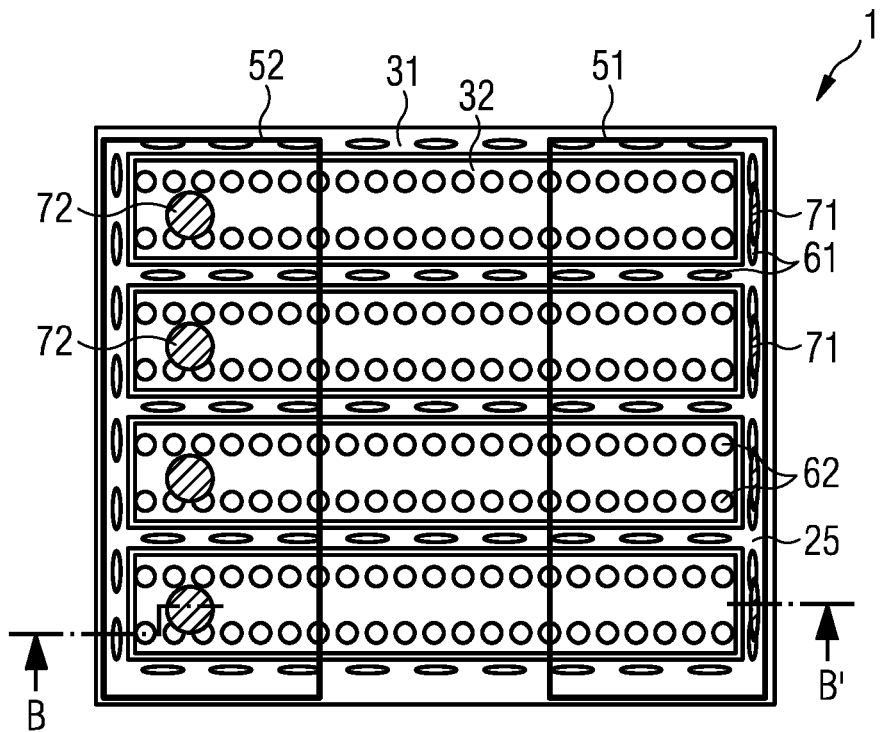

FIGS. 2A and 2B show another example of an optoelectronic semiconductor chip. This example corresponds essentially to the example described in connection with FIGS. 1K and 1L and can in particular be produced largely as described above, especially with only five photolithographic planes.

In contrast, the terminal layer 3, in particular the first terminal layer region 31, extends up to the side surface 15 of the semiconductor chip 1. The first terminal layer region 31, the first semiconductor layer 21 and the substrate 4 are flush with the side surface 15.

In the manufacture of such an optoelectronic semiconductor chip, the terminal layer 3 is cut through during singulation, in contrast to the example described in FIGS. 1A to 1L. By the first terminal layer region 31 extending up to the side surface 15 of the semiconductor chip, the radiation portion can be reduced which exits laterally from the optoelectronic semiconductor chip 1. These radiation portions can be absorbed to an increased extent, for example, at the connection board. If a radiation conversion element is arranged on the substrate 4 (not explicitly shown in the figures), this radiation portion can also lead to an undesired color location shift since the radiation portion can exit the optoelectronic semiconductor chip 1 completely unconverted.

With the described methods, optoelectronic semiconductor chips characterized by high efficiency can be produced in a simple, reliable and cost-effective way.

My chips and methods are not limited by the description of the examples. Rather, this disclosure includes any new feature and any combination of features, which in particular includes any combination of features in the appended claims, even if the feature or combination itself is not explicitly mentioned in the claims or examples.

This application claims priority of DE 102017111123.9, the subject matter of which is incorporated herein by reference.

The invention claimed is:

1. An optoelectronic semiconductor chip comprising:
a semiconductor layer sequence having an active region that generates radiation, a first semiconductor layer and a second semiconductor layer, the active region being arranged between the first semiconductor layer and the second semiconductor layer;
a first contact and a second contact for external electrical contacting of the semiconductor chip;
a first terminal layer region, via which the first contact electrically conductively connects to the first semiconductor layer;
a second terminal layer region, via which the second contact electrically conductively connects to the second semiconductor layer; and
a first insulation layer and a second insulation layer;
wherein
the first terminal layer region and the second terminal layer region are each arranged in some areas between the first insulation layer and the second insulation layer in a vertical direction perpendicular to a main extension plane of the active region;
the first terminal layer region and the second terminal layer region are arranged side by side without overlapping;
the first terminal layer region extends in places up to a side surface of the semiconductor chip, and
the first terminal layer region completely runs around the active region in a lateral direction.

2. The optoelectronic semiconductor chip according to claim 1, wherein the first insulation layer and the second insulation layer each comprises a plurality of sublayers and forms a dielectric mirror structure.

3. The optoelectronic semiconductor chip according to claim 1, wherein the second insulation layer runs around the first terminal layer region in a lateral direction.

4. The optoelectronic semiconductor chip according to claim 1, wherein the first terminal layer region and the second terminal layer region have the same material composition and the same layer thickness.

5. The optoelectronic semiconductor chip according to claim 1, wherein the semiconductor layer sequence is arranged on a substrate, the first contact and the second contact are arranged on a side of the semiconductor layer sequence facing away from the substrate, and radiation generated during operation of the semiconductor chip exits through the substrate.

6. The optoelectronic semiconductor chip according to claim 1, wherein the first semiconductor layer, the first terminal layer region, and a substrate are flush with the side surface.

* * * * *